United States Patent
Ramachandrarao et al.

(10) Patent No.: US 7,233,068 B2
(45) Date of Patent: Jun. 19, 2007

(54) FILLING SMALL DIMENSION VIAS USING SUPERCRITICAL CARBON DIOXIDE

(75) Inventors: Vijayakumar S. Ramachandrarao, Hillsboro, OR (US); Robert B. Turkot, Jr., Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 91 days.

(21) Appl. No.: 10/943,634

(22) Filed: Sep. 17, 2004

(65) Prior Publication Data

US 2005/0054201 A1 Mar. 10, 2005

Related U.S. Application Data

(62) Division of application No. 10/393,712, filed on Mar. 21, 2003, now Pat. No. 6,812,132.

(51) Int. Cl.
*H01L 23/48* (2006.01)
*H01L 23/52* (2006.01)
*H01L 29/40* (2006.01)

(52) U.S. Cl. .................... 257/741; 257/E23.011

(58) Field of Classification Search .............. 257/1; 438/689

See application file for complete search history.

(56) References Cited

U.S. PATENT DOCUMENTS

| | | | | |
|---|---|---|---|---|
| 6,057,409 | A * | 5/2000 | Cunningham et al. | 526/201 |
| 6,261,469 | B1 * | 7/2001 | Zakhidov et al. | 216/56 |
| 6,406,995 | B1 * | 6/2002 | Hussein et al. | 438/638 |
| 6,444,495 | B1 * | 9/2002 | Leung et al. | 438/118 |
| 6,790,773 | B1 * | 9/2004 | Drewery et al. | 438/643 |
| 2001/0037007 | A1 * | 11/2001 | Lousenberg et al. | 526/255 |
| 2003/0008989 | A1 * | 1/2003 | Gore et al. | 526/227 |
| 2003/0215572 | A1 * | 11/2003 | Nojiri et al. | 427/294 |
| 2005/0110145 | A1 * | 5/2005 | Elers | 257/758 |

* cited by examiner

*Primary Examiner*—Evan Pert
*Assistant Examiner*—Benjamin P. Sandvik
(74) *Attorney, Agent, or Firm*—Trop, Pruner & Hu, P.C.

(57) ABSTRACT

Suitable particles may be deposited within an extremely small high-aspect ratio via by flowing the particles in a suspension using supercritical carbon dioxide. The particles may be made up of diblock copolymers or silesquioxane-based materials or oligomers of phobic homopolymers or pre-formed silica-based particles stabilized using diblock copolymers and may include chemical initiators to permit in situ polymerization within the via.

15 Claims, 1 Drawing Sheet

FILLING SMALL DIMENSION VIAS USING SUPERCRITICAL CARBON DIOXIDE

This is a divisional of prior Application No. 10/393,712, filed Mar. 21, 2003 now U.S Pat. No. 6,812,132.

BACKGROUND

This invention relates to processes for making semiconductor integrated circuits and, particularly, to techniques used for filling relatively small dimension vias.

In the process of forming dual damascene patterns, the back end of the line process of semiconductor manufacturing may use the via first patterning approach. In such a process, an interlayer dielectric may be patterned with a relatively smaller-diameter via than the corresponding metal/trench layer. An anti-reflective coating may then be used to fill the via and to coat the interlayer dielectric for the subsequent trench pattern (for lithographic concerns).

The via fill, generally, is obtained by the spin-coating of a solution of a polymeric material in a solvent and an evaporation of the solvent with a solid material, filling the via in the interlayer dielectric.

As the dimensions of the via and the interconnects continue to shrink with ongoing advances in semiconductor lithography, the limit of dimensions where the liquid is able to enter and fill the via is being reached due to the high liquid viscosity of the polymeric or oligomeric solution. In other words, the viscosity of the solution is sufficient, even if very low, to prevent the complete filling of extremely fine vias.

Further, the removal of the solvent through evaporation may also be detrimental to the structure, due to the high capillary forces involved. The increase in the aspect ratio of the features makes entry of the solutions into those features relatively difficult. In other words, when the via becomes sufficiently small, it is relatively hard to remove the solvent from the structure due to capillary forces and to get the solution into the structure because of capillary forces without damage to the features.

Thus, there is a need for better ways to fill relatively small dimension vias in advanced semiconductor processes.

DETAILED DESCRIPTION

Figure 1:
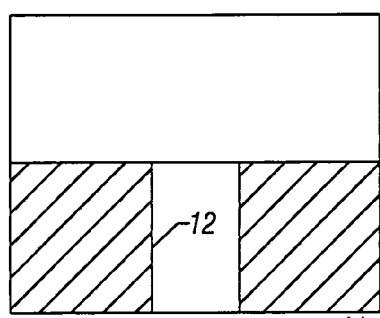
FIG. 1 is an enlarged cross-sectional view of one embodiment of the present invention at an early stage of manufacture.

Supercritical carbon dioxide, with its low viscosity and low surface tension, is capable of wetting virtually all surfaces and is able to enter and leave small sized features in interlayer dielectrics and other structures. Supercritical carbon dioxide is formed when carbon dioxide is heated above 31° C. at pressures above 1070 pounds per square inch. Further, the removal of supercritical carbon dioxide as a gas during depressurization that is devoid of any capillary forces leaves the features intact.

Supercritical carbon dioxide may be used as a solvent for generation of a suspension of particles/micelles of oligomeric species.

Certain monomers and oligomers are rich in fluorine and silicon. Examples of such monomers and oligomers include fluorocarbons and siloxanes that are soluble in carbon dioxide due to favorable chemical interactions. A suspension of particles comprised of such monomers and oligomers may be created such that particles of varying dimensions on the order of a few nanometers may be created. These particles may be stabilized using diblock copolymers, such as polystyrene-block-poly fluoromethyl methacrylate or polystyrene-block-polydimethyl siloxane, with a corona of the particle or micelle having favorable interactions, like fluorocarbons or siloxanes, and the core of the micelle with organic content such as polystyrene. The diblock copolymers themselves form particles in certain cases and they can also be used as stabilizers for particles that are made of $CO_2$-phobic species like polystyrene, etc. (non-fluorinated/non-siloxane containing hydrocarbon oligomers).

The size of the micelle or particle can be controlled by the size of the blocks of a diblock copolymer, the carbon dioxide density, the chemical makeup of the side groups of the diblock copolymers or the degree of crosslinking of hydrogen silesquioxane or methyl-silesquioxane (HSQ-based or MSQ-based) silica particles.

As an example, the size of the particles may be from 5 nm to 40 nm depending on the side groups of the diblock copolymers and molecular weights of the diblock copolymers. In one embodiment the size of the blocks of the diblock copolymer may be from 3-4 repeat units of the blocks of the diblock copolymer and the carbon dioxide density may be from 0.1 to 1.0 gm/cc. The chemical makeup of the side groups of the diblock copolymers may be siloxane-based or fluoroacrylates as one of the diblocks and alykl or aromatic hydrocarbon-based as the other block and also the use of other anti-solvents, liquid or supercritical (like ethane) for creation and stabilization of the particles in some embodiments.

The micelles may be suspended in supercritical carbon dioxide and may be manipulated to fill a via due to gravity (in which case the tunability of carbon dioxide density is very useful) or other active forces, like electric fields, when appropriate molecules are used as the core of the micelle (particle). The particles may be drawn to the top surface of the interlayer dielectric and can be swept away by flowing supercritical carbon dioxide. The ability to flow the supercritical carbon dioxide is facilitated by its low viscosity.

Due to their high fluorine content, the particles can be envisioned to be less adhesive in nature, maintaining their integrity and not chemically/physically attaching to the dielectric surface. The suspension can also be designed to contain chemical initiators like benzoyl peroxide for initiating the polymerization of the particles, at a higher temperature, to prepare a continuous filling once the vias are filled with the particles to be polymerized. After the vias are filled with solid material, another film of an identical or similar chemical nature may be spun coated from regular liquid solutions for creating a smooth top surface, if desired. Aromatic molecules that function as dyes for the absorption of irradiated light used for developing photoresists can also be incorporated through this process from the suspension/dispersion in supercritical carbon dioxide to create essentially an antireflective coating for the subsequent patterning of the trenches in the dual damascene process.

Further, pre-formed sub-20 nm-sized particles can also be used in this technique to be displaced in the vias by flowing supercritical carbon dioxide.

Referring to FIG. 1, a dielectric 10 may be formed with a via 12 which may be on the order of about 10 to about 45 nanometers in one embodiment. The via 12 may be filled by pre-formed or in situ formed particles 16 suspended in supercritical carbon dioxide within a chamber 14 over the dielectric 10. The dielectric 10 may be formed over a support structure 11 in some embodiments.

Figure 3:
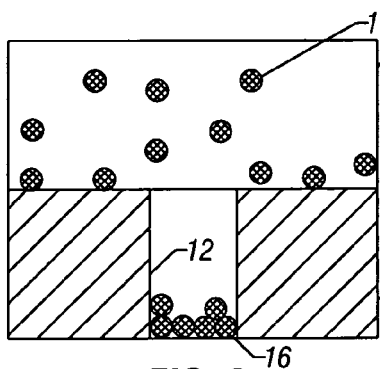
FIG. 3 is an enlarged cross-sectional view of still a subsequent stage of manufacture in accordance with one embodiment of the present invention.

The particles 16, which may also be called micelles, may be allowed to settle down into the via due to gravity or other forces as shown in FIG. 3. The particles on top of the dielectric 10 may be swept away by the flowing supercritical carbon dioxide as shown in FIG. 4.

Figure 2:
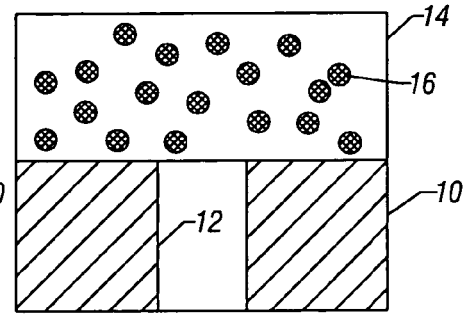
FIG. 2 is an enlarged cross-sectional view of the embodiments shown in FIG. 1 at a subsequent stage of manufacture.
Figure 4:
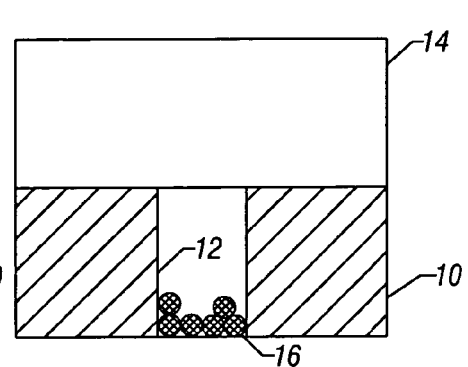
FIG. 4 is an enlarged cross-sectional view at a subsequent stage of manufacture in accordance with one embodiment of the present invention.
Figure 5:
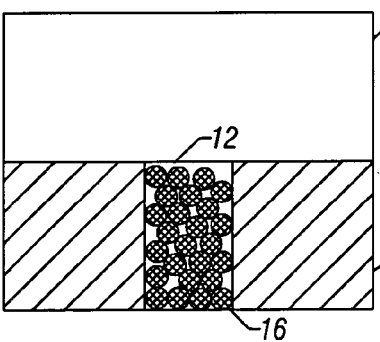
FIG. 5 is an enlarged cross-sectional view at a subsequent stage of manufacture in accordance with one embodiment of the present invention.
Figure 6:
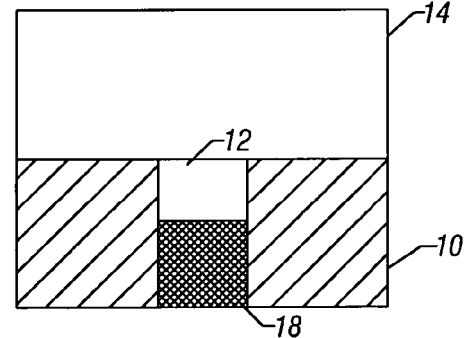
FIG. 6 is an enlarged cross-sectional view at a subsequent stage of manufacture in accordance with one embodiment of the present invention.

Referring to FIG. 5, the steps shown in FIGS. 2, 3, and 4 may be repeated until the via 12 is substantially filled with particles 16. At this point, the supercritical carbon dioxide flow may be terminated, and the chamber 14 may be heated to polymerize or "fuse" the particles 16 to form the polymer material 18 shown in FIG. 6. A portion of the via 12 still remains unfilled at this stage in some embodiments.

Figure 7:
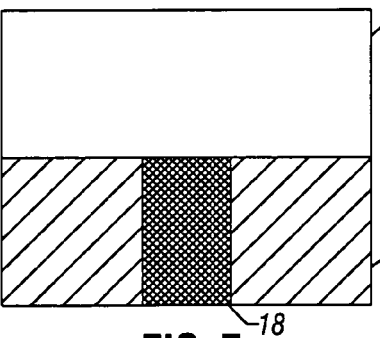
FIG. 7 is an enlarged cross-sectional view at a subsequent stage of manufacture in accordance with one embodiment of the present invention.
Figure 8:
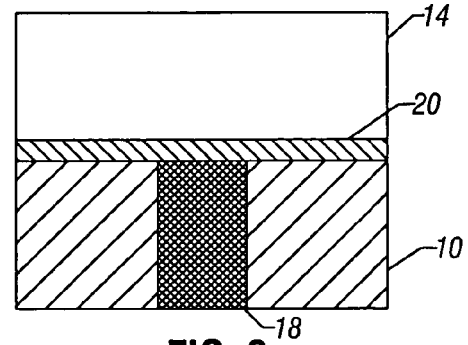
FIG. 8 is an enlarged cross-sectional view at a subsequent stage of manufacture in accordance with one embodiment of the present invention.

The steps shown in FIGS. 2-6 may be repeated until the via 12 is completely filled with the filled 18 as shown in FIG. 7. Thereafter, a spin coating of a solution 20 may be formed, if desired. The material 20 may be of the same or different material than the particles 16 or the bulk material 18.

As a result, high-aspect ratio vias having a size less than 40 nanometers may be filled from solutions or suspensions of polymers or silica or other HSQ or MSQ-based material in supercritical carbon dioxide. The relatively low surface tension and viscosity of the supercritical carbon dioxide, as well as its excellent wetability, facilitates this process. The favorable interactions of fluorocarbons and polydimethyl siloxane and small molecular dyes may be used to form anti-reflective coatings. In situ polymerization of monomers and oligomers in suspended particles in supercritical carbon dioxide are feasible. Good control of particle size or particles suspended in the supercritical carbon dioxide may be achieved.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor structure comprising:
   an interlayer dielectric;
   a via contained in said interlayer dielectric; and
   a plurality of particles suspendable in supercritical carbon dioxide deposited in said via, said particles including fluorocarbon.

2. The structure of claim 1 wherein said particles include monomers.

3. The structure of claim 1 wherein said particles include oligomers.

4. The structure of claim 1 wherein said particles include siloxanes.

5. The structure of claim 2 wherein said particles are stabilized using diblock copolymers.

6. The structure at claim 1 including a dye in said via.

7. The structure of claim 1 wherein said via is less than about 45 nanometers.

8. The structure of claim 1 wherein said particles include a polymerization initiator.

9. A semiconductor structure comprising:
   an interlayer dielectric;
   a via formed in said interlayer dielectric;
   a plurality of particles deposited in said via, said particles including a polymerization initiator.

10. The structure of claim 9 wherein said particles are suspendable in supercritical carbon dioxide.

11. The structure of claim 9 wherein said particles include monomers.

12. The structure of claim 9 wherein said particles include oligomers.

13. The structure of claim 9 wherein said particles include fluorocarbons.

14. The structure of claim 10 wherein said particles are stabilized using diblock copolymers.

15. The structure of claim 9 wherein said via is less than about 45 nanometers.

* * * * *

UNITED STATES PATENT AND TRADEMARK OFFICE
CERTIFICATE OF CORRECTION

PATENT NO.      : 7,233,068 B2
APPLICATION NO. : 10/943634
DATED           : June 19, 2007
INVENTOR(S)     : Vijayakumar S. RamachandraRao et al.

It is certified that error appears in the above-identified patent and that said Letters Patent is hereby corrected as shown below:

Column 4:
Line 22, Claim 5, "arc" should be --are--;
Line 24, Claim 6, "structure at" should be --structure of--.

Signed and Sealed this

Twenty-fifth Day of December, 2007

JON W. DUDAS
*Director of the United States Patent and Trademark Office*